United States Patent [19]
Johnson

[11] Patent Number: 5,920,223
[45] Date of Patent: Jul. 6, 1999

[54] METHOD AND APPARATUS TO IMPROVE IMMUNITY TO COMMON-MODE NOISE

[75] Inventor: Robert Anders Johnson, San Jose, Calif.

[73] Assignee: Xilinx, Inc., San Jose, Calif.

[21] Appl. No.: 08/766,378

[22] Filed: Dec. 12, 1996

[51] Int. Cl.[6] .................................................. H03K 5/08
[52] U.S. Cl. ........................ 327/309; 327/306; 327/312; 327/319; 327/321; 327/382; 327/52; 327/90; 327/310
[58] Field of Search ................................ 327/51, 52, 63, 327/68, 311, 362, 437, 560, 563, 312, 323, 309, 321, 379, 382, 90, 310; 330/258

[56] References Cited

U.S. PATENT DOCUMENTS 4,471,451  9/1984  Schenck ..................................... 327/54
5,587,681  12/1996 Fobbester .................................. 327/307
5,675,392  10/1997 Nayebi et al. ............................ 348/584

*Primary Examiner*—Dinh Le
*Attorney, Agent, or Firm*—Edel M. Young; E. Eric Hoffman

[57] ABSTRACT

The present invention provides a method and apparatus for improving immunity to common mode noise. The present invention prevents common mode noise from exceeding acceptable limits. The present invention is also useful to prevent common mode noise from being converted to differential mode noise by the action of parasitic diodes. One embodiment of the present invention bleeds charge off two differential lines such that the relative voltage differential is maintained, for example during a memory read, until at least one of the lines is low enough that the maximum possible upward noise (common+differential) is insufficient to turn on the parasitic diodes coupled to the positive voltage supply, leaving enough margin on the differential signal to allow a sensing circuit to accurately sense the differential signal.

24 Claims, 7 Drawing Sheets

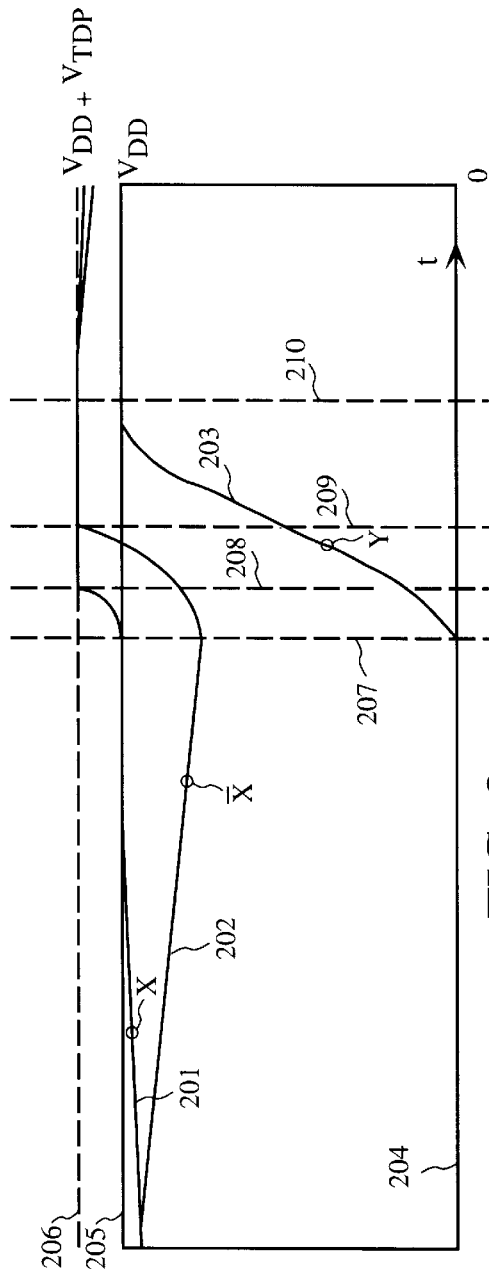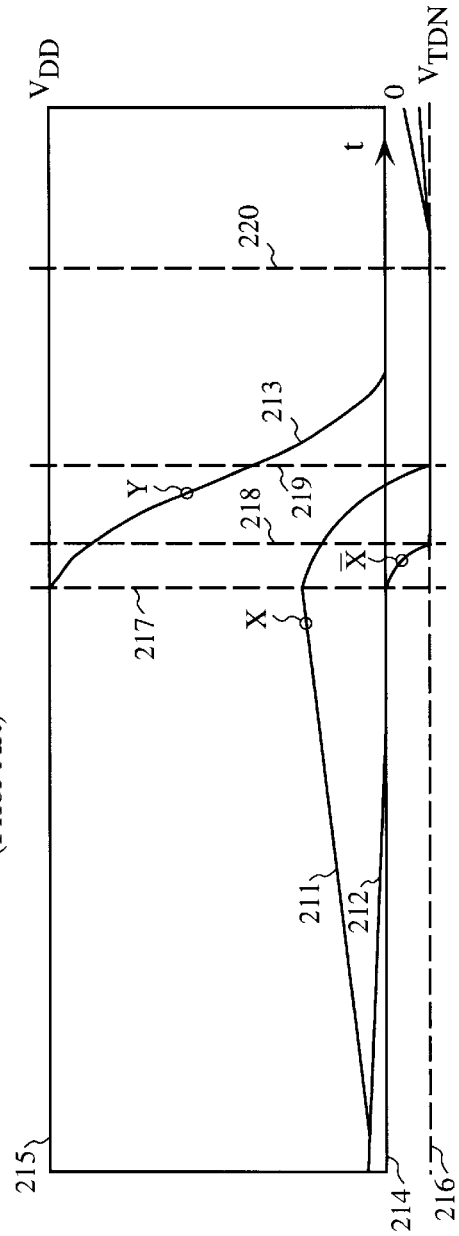
FIG. 2a (Prior Art)
FIG. 2b (Prior Art)

METHOD AND APPARATUS TO IMPROVE IMMUNITY TO COMMON-MODE NOISE

FIELD OF THE INVENTION

The present invention relates generally to differential circuits and particularly to techniques for increasing the immunity of differential circuits to common mode noise.

BACKGROUND ART

Differential circuits are circuits that provide and detect a voltage difference between two conductive lines. Differential circuits are ideally immune to small amounts of common mode noise. Nonetheless, such circuits may fail if a sufficient amount of common mode noise is present. Common mode noise is a disturbance that affects a plurality of lines similarly (e.g., causing a change of voltage of similar polarity and amplitude on each of the lines).

Common mode noise may be induced upon differential lines by another line that is parasitically coupled to the differential lines. The lines may be conductors, for example conductors formed in a metal layer of an integrated circuit or wires. The lines may carry signals. The signals carried by the line that is parasitically coupled to the differential lines may affect the signals carried by the differential lines through the effect of the parasitic coupling.

For example, if a line is in close proximity to the differential lines, a parasitic capacitance may exist between the line and each of the differential lines (referred to here as a parasitic capacitor). A current may flow through the parasitic capacitors and alter the amount of charge on the differential lines.

Since I=C dV/dt, the amount of current flowing through the parasitic capacitors is proportional to the capacitance of the parasitic capacitors and to the rate of voltage change on the line that is influencing the differential lines. Thus, signals that change voltage quickly, such as digital signals, can induce large amounts of common mode current noise on differential lines. If the source of the differential signal has a large output impedance, then current noise translates into voltage noise according to the relationship V=IR. Since digital signals are prevalent in modern electronic circuits, the introduction of common mode noise on differential lines is difficult to avoid.

While differential circuits are often designed to have a high common mode rejection ratio and thereby reject common mode noise, other effects can result in common mode noise being converted to differential mode noise. Differential mode noise is a disturbance that affects a plurality of lines dissimilarly (e.g., causing a change of voltage of opposite polarity and/or different amplitude on each of the lines). Differential mode noise can affect a differential circuit much more adversely than common mode noise. Parasitic diodes between a signal line and positive or negative voltage supplies often result from practical semiconductor fabrication techniques. Also, diodes may be intentionally introduced between a signal line and positive or negative voltage supplies to improve immunity to electrostatic discharge effects.

When the amplitude of common mode noise introduced on a differential pair causes the voltage on either or both of the differential lines to exceed the thresholds at which the parasitic diodes begin to conduct, current flows through the parasitic diodes, causing charge to be added to or removed from the differential lines in unequal amounts. Differential mode noise results from this unequal change in charge on the differential lines. Thus, the parasitic diodes can effectively convert common mode noise to differential mode noise. If the parasitic diodes of both differential lines begin to conduct, the signal carried by the differential lines may be completely lost, preventing proper operation of the differential circuit.

FIG. 1 is a schematic diagram illustrating a differential circuit affected by parasitic elements. The differential circuit comprises high impedance source 101, differential sense circuit 102, differential line 103, differential line 104, and output 105. High impedance source 101 may be a memory cell or another source. The differential circuit also comprises parasitic elements 106, which are usually unwanted and unavoidable, but commonly result from practical semiconductor fabrication techniques. Parasitic elements 106 comprise parasitic capacitors 108, 109, 111, and 112, and parasitic diodes 115, 116, 117, and 118.

High impedance source 101 provides a differential output signal at the pair of differential lines that comprises differential line 103 and differential line 104. Differential lines 103 and 104 are coupled to inputs of differential sense circuit 102. Differential sense circuit 102 provides an output signal at output 105.

Line 107 passes near or across differential lines 103 and 104 and induces voltage changes on differential lines 103 and 104. Line 107 induces a voltage changes on differential line 103 via parasitic capacitor 108 and on differential line 104 via parasitic capacitor 109. Line 107 is coupled to a first terminal of parasitic capacitor 108 and to a first terminal of parasitic capacitor 109. A second terminal of parasitic capacitor 108 is coupled to differential line 103. A second terminal of parasitic capacitor 109 is coupled to differential line 104.

A first terminal of each of parasitic capacitors 111 and 112 is coupled to ground potential 110. A second terminal of parasitic capacitor 111 is coupled to differential line 103. A second terminal of parasitic capacitor 112 is coupled to differential line 104. Parasitic capacitors such as parasitic capacitor 111 and 112 between differential lines and a ground potential often result from proximity of the differential lines to ground potentials, such as a ground plane, or to DC voltage supplies or other conductors at DC voltages.

Parasitic diodes also exist between differential lines and positive (e.g., $V_{DD}$) and negative (e.g., ground) voltage supplies. The cathode of parasitic diode 115 is coupled to positive voltage supply 113. The anode of parasitic diode 115 is coupled to differential line 103. The cathode of parasitic diode 116 is coupled to differential line 103. The anode of parasitic diode 116 is coupled to negative voltage supply 114, which may be a ground potential. The cathode of parasitic diode 117 is coupled to positive voltage supply 113. The anode of parasitic diode 117 is coupled to differential line 104. The cathode of parasitic diode 118 is coupled to differential line 104. The anode of parasitic diode 118 is coupled to negative voltage supply 114.

FIGS. 2a and 2b are diagrams illustrating an effect whereby parasitic diodes 115, 116, 117, and 118 can cause common mode noise induced on differential lines 103 and 104 by line 107 to result in differential mode noise on differential lines 103 and 104. FIG. 2a illustrates a possible effect of a positive-going transition of the signal on line 107. FIG. 2b illustrates a possible effect of a negative-going transition of the signal on line 107.

Waveform 201 represents voltage x at differential line 103. Waveform 202 represents voltage $\bar{x}$ at differential line 104. Waveform 203 represents voltage y at line 107. Waveforms 201, 202, and 203 are shown relative to zero voltage level 204 representative of negative voltage supply 114, $V_{DD}$ voltage level 205 representative of positive voltage supply 113, and $V_{DD}+V_{TDP}$ voltage level 206 representative of positive voltage supply 113 plus the forward voltage of parasitic diodes 115 and 117.

Waveforms 201, 202, and 203 are shown with time increasing from left to right. Waveforms 201 and 202 begin somewhat below $V_{DD}$ voltage level 205. Waveform 201 increases in voltage over time, while waveform 202 decreases in voltage over time. The divergence of waveforms 201 and 202 represents an increasing differential mode signal being provided by high impedance source 101.

At time 207, waveform 203 begins its transition from zero voltage level 204 to $V_{DD}$ voltage level 205. As waveform 203 begins to increase in voltage, its voltage change induces a voltage change in waveforms 201 and 202 through the effect of parasitic capacitors 108 and 109. The induced voltage on differential line 103 causes waveform 201 to continue to rise until it reaches $V_{DD}+V_{TDP}$ voltage level 206 at time 208, at which point parasitic diode 115 begins to conduct and to clamp the voltage on differential line 103 at $V_{DD}+V_{TDP}$ voltage level 206.

The induced voltage on differential line 104 causes waveform 202 to continue to rise until it reaches $V_{DD}+V_{TDP}$ voltage level 206 at time 209, at which point parasitic diode 117 begins to conduct and to clamp the voltage on differential line 104 at $V_{DD}+V_{TDP}$ voltage level 206. After waveform 203 completes its transition to $V_{DD}$ voltage level 205 at time 210, line 107 no longer induces a voltage on differential lines 103 and 104, and waveforms 201 and 202 again begin to diverge under the influence of the output of high impedance source 101.

Beginning at time 207, the influence of waveform 203 on waveforms 201 and 202 causes common mode noise to be induced upon waveforms 201 and 202. When the parasitic diodes begin to conduct at time 208, the continuing influence of waveform 203 begins to be converted from common mode noise to differential mode noise. At time 209, when parasitic diodes are clamping both differential lines 103 and 104, the continuing influence of waveform 203 in combination with the clamping effect of the parasitic diodes results in complete suppression of the differential signal across differential lines 103 and 104.

A similar situation occurs when voltage y on line 107 makes a negative-going transition. Waveform 211 represents voltage x at differential line 103. Waveform 212 represents voltage $\bar{x}$ at differential line 104. Waveform 213 represents voltage y at line 107. Waveforms 211, 212, and 213 are shown relative to zero voltage level 214 representative of negative voltage supply 114, $V_{DD}$ voltage level 215 representative of positive voltage supply 113, and $-V_{TDN}$ voltage level 216 representative of negative voltage supply 114 minus the forward voltage of parasitic diodes 116 and 118.

Waveforms 211, 212, and 213 are shown with time increasing from left to right. Waveforms 211 and 212 begin somewhat above zero voltage level 214. Waveform 211 increases in voltage over time, while waveform 212 decreases in voltage over time. The divergence of waveforms 211 and 212 represents an increasing differential mode signal being provided by high impedance source 101.

At time 217, waveform 213 begins its transition from $V_{DD}$ voltage level 215 to zero voltage level 214. As waveform 213 begins to decrease in voltage, its voltage change induces a voltage change in waveforms 211 and 212 through the effect of parasitic capacitors 108 and 109. The induced voltage on differential line 104 causes waveform 212 to continue to fall until it reaches $-V_{TDN}$ voltage level 216 at time 218, at which point parasitic diode 118 begins to conduct and to clamp the voltage on differential line 104 at $-V_{TDN}$ voltage level 216.

The induced voltage on differential line 103 causes waveform 211 to continue to fall until it reaches $-V_{TDN}$ voltage level 216 at time 219, at which point parasitic diode 116 begins to conduct and to clamp the voltage on differential line 103 at $-V_{TDN}$ voltage level 216. After waveform 213 completes its transition to zero voltage level 214 at time 220, line 107 no longer induces a voltage on differential lines 103 and 104, and waveforms 211 and 212 again begin to diverge under the influence of the output of high impedance source 101.

Beginning at time 217, the influence of waveform 213 on waveforms 211 and 212 causes common mode noise to be induced upon waveforms 211 and 212. When the parasitic diodes begin to conduct at time 218, the continuing influence of waveform 213 begins to be converted from common mode noise to differential mode noise. At time 219, when parasitic diodes are clamping both differential lines 103 and 104, the continuing influence of waveform 213 in combination with the clamping effect of the parasitic diodes results in complete suppression of the differential signal across differential lines 103 and 104.

Thus, the need for a technique to improve immunity to common mode noise resulting from voltage changes on line 107 can be readily appreciated.

In the past, such common mode noise problems have been addressed by attempting to make the ratio of $C_y$ to $C_g$ as small as possible. However, there is a finite limit to how small $C_y$ can be in a practical implementation. Thus, to make the ratio of $C_y$ to $C_g$ small, $C_g$ has to be larger than its smallest practical value. The larger $C_g$ is, the more it adversely affects the performance of the circuit. While a large $C_g$ results in reduced common mode noise, it also increases the sensing time required by the differential sense circuit, slowing down the operation of the circuit.

Another approach that has been used to reduce common mode noise is to limit the number of lines that are allowed to carry signals that switch in a manner that might induce common mode noise on the differential lines. However, such a limitation introduces an additional constraint that can also reduce performance of the circuit. Moreover, such an approach does not actually fortify the differential lines against common mode noise, but attempts to avoid signals that might cause common mode noise. The differential lines remain sensitive to the effects of common mode noise and may be adversely affected by other sources of common mode noise.

Thus, a better technique for improving immunity to common mode noise is needed.

SUMMARY OF THE INVENTION

The present invention provides a method and apparatus for improving immunity to common mode noise. The present invention prevents common mode noise from exceeding acceptable limits. The present invention is also useful to prevent common mode noise from being converted to differential mode noise by the action of parasitic diodes.

One embodiment of the present invention symmetrically bleeds charge off of differential lines, for example during a memory read, until at least one of them is low enough so that the maximum possible upward noise (common+differential) is insufficient to turn on the parasitic diodes coupled to the positive voltage supply, with enough margin on the differential signal to allow a sensing circuit, such as a data sense amplifier, to accurately sense the differential signal.

One embodiment of the present invention provides a method for improving immunity to common mode noise. This method comprises the steps of monitoring voltages on two differential lines, determining if the voltages exceed a level, and draining equal amounts of charge from the two differential lines. The step of monitoring the voltages on the two differential lines may comprise the steps of monitoring a first voltage on a first line of the two differential lines and monitoring a second voltage on a second line of the two differential lines.

The step of determining if the voltages exceed a level may comprise the steps of determining if the first voltage exceeds the level and determining if the second voltage exceeds the level. The step of draining equal amounts of charge from the two differential lines may comprise the step of draining equal amounts of charge from the two differential lines to a negative voltage supply. The step of draining equal amounts of charge from the two differential lines may comprise the step of draining equal amounts of charge from the two differential lines to a positive voltage supply.

One embodiment of the present invention provides an apparatus for improving immunity to common mode noise. This apparatus comprises a pair of differential lines. The pair of differential lines comprises a first differential line and a second differential line. The apparatus also comprises a sensing circuit coupled to the pair of differential lines for sensing a first voltage on a first differential line, for sensing a second voltage on a second differential line, and for providing an indication if either of the first voltage or the second voltage exceeds a level. The apparatus further comprises a charge draining circuit coupled to the sensing circuit for draining charge from the pair of differential lines.

The charge draining circuit may drain charge from the pair of differential lines upon receiving the indication. The apparatus may further comprise an inverter for inverting the indication and for coupling the sensing circuit to the charge draining circuit. The charge draining circuit may drain charge equally from the first differential line and from the second differential line.

The charge draining circuit may comprise a current mirror circuit. The current mirror circuit may comprise a plurality of metal oxide semiconductor (MOS) devices. The sensing circuit may comprise a plurality of complementary metal oxide semiconductor (CMOS) devices. The sensing circuit may comprise a first semiconductor device coupled to the first differential line and a second semiconductor device coupled to the second differential line.

The sensing circuit further may further comprise a third semiconductor device coupled to the first differential line and a fourth semiconductor device coupled to the second differential line. The charge draining circuit may further comprise a fifth semiconductor device coupled to the first differential line and a sixth semiconductor device coupled to the second differential line. The charge draining circuit may further comprise a seventh semiconductor device coupled to the fifth semiconductor device and to the sixth semiconductor device. The first, second, third, fourth, fifth, sixth, and seventh semiconductor devices may comprise metal oxide semiconductor (MOS) transistors.

BRIEF DESCRIPTION OF THE DRAWINGS

FIGS. 2a and 2b are diagrams illustrating an effect whereby parasitic diodes can cause common mode noise induced on differential lines to result in differential mode noise on the differential lines.

DETAILED DESCRIPTION OF THE INVENTION

A method and apparatus for improving immunity to common mode noise is described. In the following description, numerous specific details are set forth in order to provide a more thorough understanding of the present invention. It will be apparent, however, to one skilled in the art, that the present invention may be practiced without these specific details. In other instances, well-known features have not been described in detail in order not to unnecessarily obscure the present invention.

The present invention provides a method and apparatus for preventing common mode noise induced on a pair of differential lines from exceeding acceptable limits. The present invention prevents common mode noise from being converted to differential mode noise by the action of parasitic diodes.

The present invention may be used with circuits that have lines that switch unpredictably or at inconvenient times, for example when a desired signal is present on a pair of differential lines. One embodiment of the present invention may be used with circuits such as static random access memories (SRAMs). In memory circuits, it is often advantageous to make memory cells as small as possible to maximize the number of memory cells that can be fabricated in a given area. However, a small memory cell often provides rather poor drive signals. Thus, a differential output of a memory cell changes slowly and requires some time to be sensed accurately. While the differential output is being sensed, other lines, such as word lines or other logic signal lines, may be switching. The influence of such switching may be parasitically coupled to the differential output of the memory cell, interfering with accurate sensing of the memory cell output signal.

Figure 1:
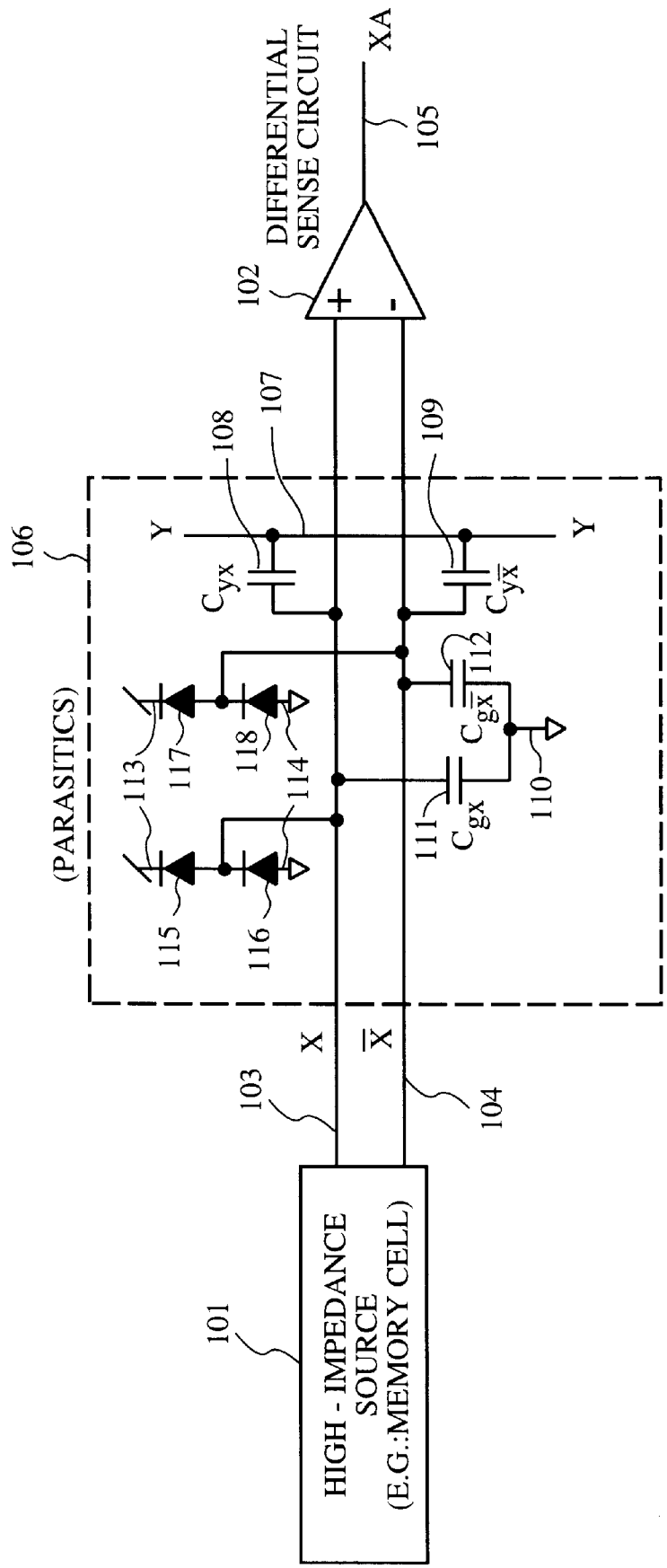
FIG. 1 is a schematic diagram illustrating a differential circuit affected by parasitic elements.
Figure 3:
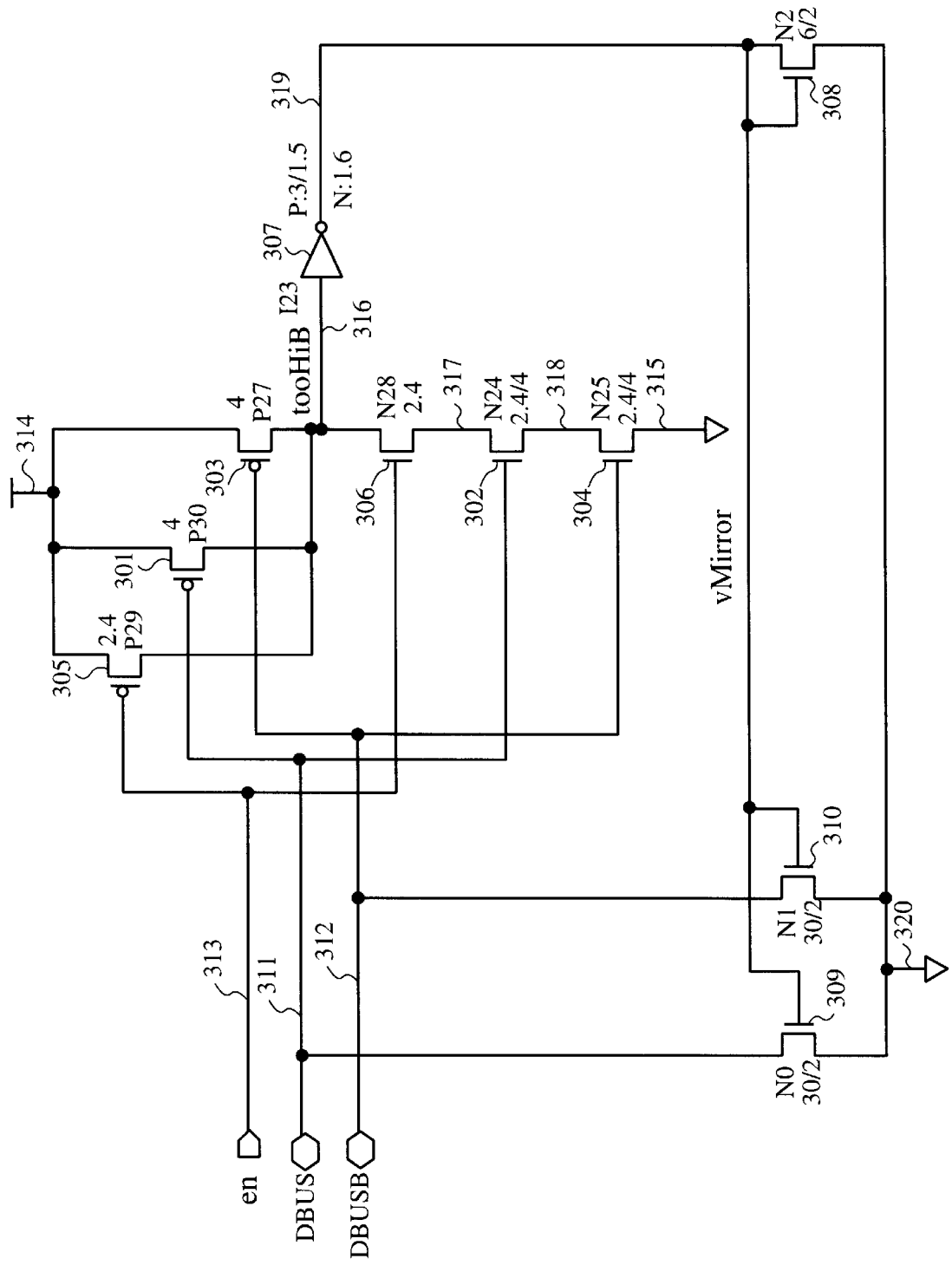
FIG. 3 is a schematic diagram illustrating one embodiment of a circuit according to the present invention.

FIG. 3 is a schematic diagram illustrating one embodiment of a circuit according to the present invention. The circuit comprises an inverter 307 and transistors 301, 302, 303, 304, 305, 306, 308, 309, and 310. Differential line 311 is coupled to the gate of PMOS transistor 301, to the gate of NMOS transistor 302, and to the drain of NMOS transistor 309. Differential line 312 is coupled to the gate of PMOS transistor 303, to the gate of NMOS transistor 304, and to the drain of NMOS transistor 310. Enable input 313 is coupled to the gate of PMOS transistor 305 and to the gate of NMOS transistor 306.

Positive voltage supply 314 is coupled to the source of each of PMOS transistors 301, 303, and 305. The drain of each of PMOS transistors 301, 303, and 305 is coupled to the drain of NMOS transistor 306 and to an input of inverter 307 via node 316. The source of NMOS transistor 306 is coupled to the drain of NMOS transistor 302 via node 317. The source of NMOS transistor 302 is coupled to the drain of NMOS transistor 304 via node 318. The source of NMOS transistor 304 is coupled to negative voltage supply 315.

The output of inverter 307 is coupled to the drain of NMOS transistor 308 and to the gate of each of NMOS transistors 308, 309, and 310 via node 319. The source of each of NMOS transistors 308, 309, and 310 is coupled to negative voltage supply 320.

PMOS transistors 301, 303, and 305 and NMOS transistors 302, 304, and 306 form a CMOS NAND gate logic circuit. Although illustrated as having complimentary MOSFET devices, the NAND gate logic circuit may also be implemented using other semiconductor devices, for example, bipolar transistors or any other devices configured to act as a suitable logic circuit. However, it is to be noted that the logic thresholds of NAND inputs 311 and 312 are significant in the operation of the circuit. Enable input 313 is provided to allow the circuit to be selectively enabled or disabled. Enable input 313 may be omitted or additional enable inputs may be provided.

NMOS transistors 302, 304, and 306 are coupled in series between node 316 and negative voltage supply 315. Since the order of NMOS transistors 302, 304, and 306 is not critical, NMOS transistors 302, 304, and 306 may be coupled in series in any order.

The NAND gate logic circuit comprising CMOS transistors 301–306, when combined with inverter 307, forms an AND gate logic circuit. The output of this AND gate logic circuit is coupled to the input of a current mirror circuit comprising NMOS transistors 308, 309, and 310. While NMOS transistors 308–310 are illustrated as n-channel MOSFET devices, the current mirror may also be implemented using other semiconductors devices, for example, bipolar transistors or any other devices configured to act as a suitable current mirror circuit. It is to be noted that the current drive capability of the AND output (when high) functions as the reference current for the current mirror.

When enable input 313 is set to a low logic level, the circuit is disabled and does not affect differential lines 311 and 312. When enable input 313 is set to a high logic level, the circuit is enabled. When the circuit is enabled and the voltage of either differential line 311 or differential line 312 is inadequate to turn on NMOS transistors 302 and 304 and/or turn off PMOS transistors 301 and 303, node 316 remains at a high level, and node 319 remains at a low level. With node 319 at a low level, NMOS transistors 308–310 do not conduct and do not affect differential lines 311 and 312.

When the circuit is enabled and the voltages of differential lines 311 and 312 are both sufficient to turn off PMOS transistors 301 and 303 and/or turn on NMOS transistors 302 and 304, node 316 goes to a low level, and node 319 goes to a high level. With node 319 at a high level, NMOS transistors 308–310 conduct and draw equal amounts of charge off differential lines 311 and 312.

When transistors 309 and 310 draw sufficient charge off differential lines 311 and 312, the voltages on differential lines 311 and 312 is reduced sufficiently to allow NMOS transistors 302 or 304 to turn off and/or PMOS transistors 301 or 303 to turn on, node 316 then returns to a high level and node 319 returns to a low level. With node 319 at a low level, NMOS transistors 308–310 stop conducting and cease to have an influence on differential lines 311 and 312.

The relative current drive of PMOS devices 301 and 303 versus NMOS devices 302 and 304 is optimally selected such that the trip points of inputs 311 and 312 are not greater than $V_{DD}+V_{TDP}$–(maximum possible noise)–(minimum sense margin). Thus, at least one of differential lines 311 and 312 cannot be clamped to $V_{DD}$ by a noise event after NMOS transistors 308–310 stop conducting. However, the trip points of inputs 311 and 312 are optimally no lower than necessary to meet this criterion, in order to minimize the amount of charge drawn off differential lines 311 and 312, which minimizes the additional power consumed by the circuit.

Node 319 is clamped to negative voltage supply 320 by NMOS transistor 308. Thus, node 319 has a voltage slightly above the threshold of NMOS devices. The voltage of node 319 is low enough to keep NMOS transistors 309 and 310 in the saturated region when the circuit is operating to drain charge from differential lines 311 and 312. Therefore, NMOS transistors 309 and 310 conduct current independent of the voltages on differential lines 311 and 312. Because of this independence, NMOS transistors 309 and 310 drain equal amounts of charge from each of differential lines 309 and 310, preventing disturbance of the differential mode signals carried by differential lines 309 and 310. When the circuit is not operating to drain charge from differential lines 311 and 312, NMOS transistors 309 and 310 are shut off and do not allow current to flow to or from differential lines 309 and 310.

Figure 4:
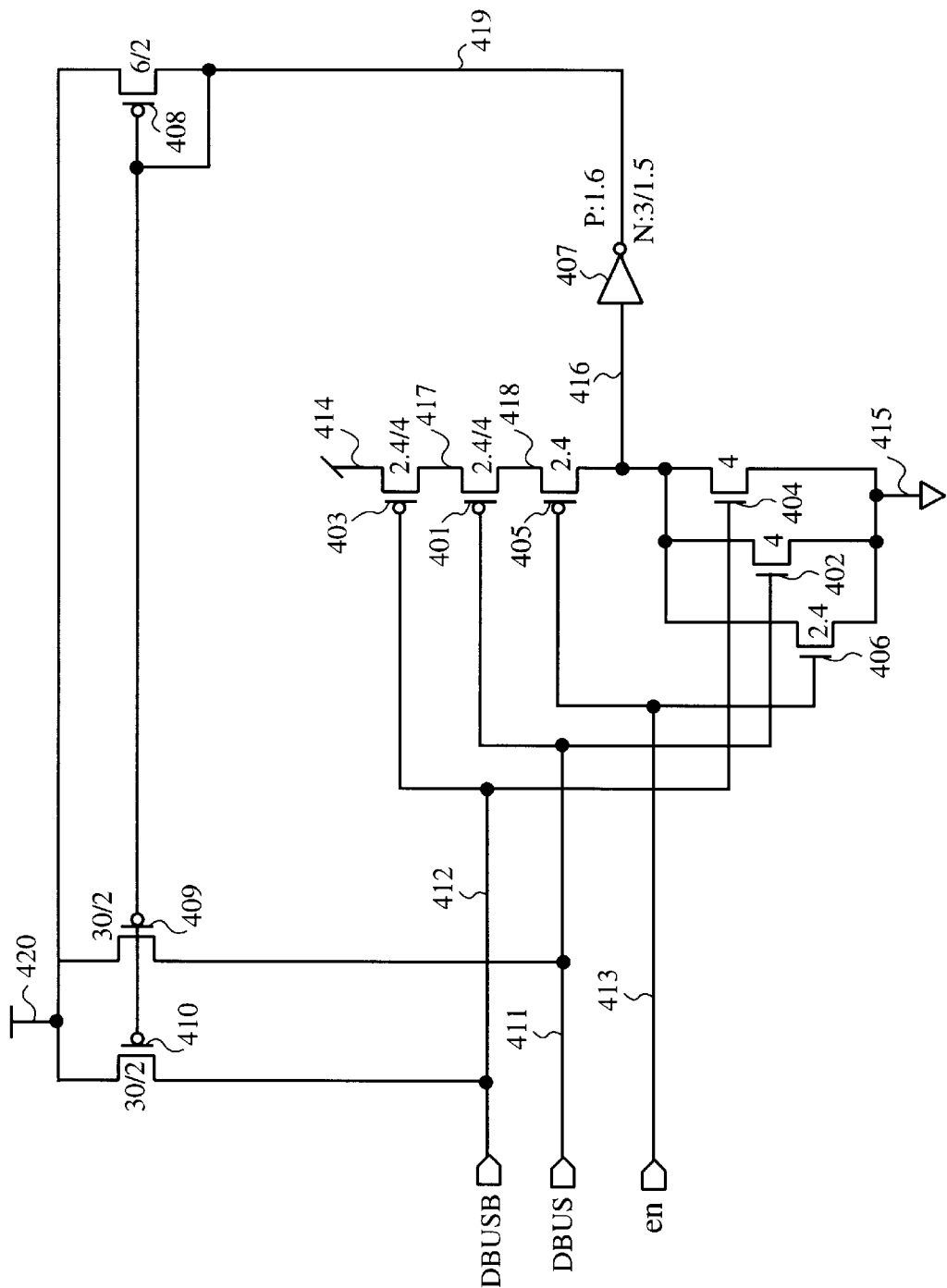
FIG. 4 is a schematic diagram illustrating one embodiment of a circuit according to the present invention.

FIG. 4 is a schematic diagram illustrating another embodiment of a circuit according to the present invention. The circuit comprises an inverter 407 and transistors 401, 402, 403, 404, 405, 406, 408, 409, and 410. Differential line 411 is coupled to the gate of PMOS transistor 401, to the gate of NMOS transistor 402, and to the drain of PMOS transistor 409. Differential line 412 is coupled to the gate of PMOS transistor 403, to the gate of NMOS transistor 404, and to the drain of PMOS transistor 410. Enable input 413 is coupled to the gate of PMOS transistor 405 and to the gate of NMOS transistor 406.

The circuit of FIG. 4 is an opposite polarity embodiment of the FIG. 3 embodiment. The operation of the FIG. 4 embodiment is similar to the operation of the FIG. 3 embodiment, except in the FIG. 4 embodiment charge is supplied to differential lines 411 and 412 from the positive voltage supply 420, whereas in the FIG. 3 embodiment charge is drained to the negative supply 320.

One embodiment of the present invention symmetrically bleeds charge off differential lines, for example during a memory read, until at least one of them is low enough that the maximum possible upward noise (common+differential) is insufficient to turn on the parasitic diodes coupled to the positive voltage supply, with enough margin on the differential signal to allow a sensing circuit, such as a data sense amplifier, to accurately sense the differential signal.

It is desirable to match the total capacitance of the differential lines to within a few percent. Otherwise, removing equal amounts of charge may result in different voltage shifts (differential noise). Alternatively, the amount of charge removed from or supplied to each differential line is proportional to the known capacitance of the line such that the resulting voltage shifts are the same or similar. This can be accomplished in the circuit of FIG. 4, for example, by making the ratio of the width of PMOS transistor 409 to the width of PMOS transistor 410 equal to the ratio of the capacitance of line 411 to the capacitance of line 412.

Special attention should be paid to the geometries of the semiconductor devices used to implement the present invention. Geometries should be selected that optimize numerous criteria. One factor to be considered is the quiescent current when node 319 is at a voltage equal to the voltage of negative voltage supply 320 plus the threshold voltage of NMOS devices or when node 419 is at a voltage equal to the voltage of positive voltage supply 420 minus the threshold voltage of PMOS devices. Another factor is the delay between a change in enable input 313 or 413 and a corresponding change in the voltage at node 319 or node 419. The noise margin of enable input 313 or 413 should also be considered.

The voltage of differential lines 311 and 312 or 411 and 412 at which the circuit begins to operate should be considered. Also, the overshoot of the point at which the circuit begins to operate should be considered, with more overshoot before ceasing, for example, to bleed charge, providing a more stable circuit. The conductance expressed as the voltage of the differential lines divided by the current through the current mirror when node 316 is low or node 416 is high should be considered, and, in one embodiment, minimized. The minimum voltage difference between the voltage of the differential lines and the voltage at the current mirror that will keep the current mirror devices saturated should be considered. Another factor to be considered is immunity to process variation.

By considering these criteria, the present invention may be applied to and optimized for a variety of implementations. The relative importance of these criteria may be weighted differently for different implementations. The weighting of the criteria affects the device geometries, for example the width to length ratios of the devices used to implement the invention.

The device geometries should be optimized for particular applications of the present invention. Typical circuit simulation software may be used to perform such optimization.

For example, one embodiment of the circuit illustrated in FIG. 3 may have transistors 301 and 303 with a width of 4 and a length of 1, where 1 is the minimum design length. The minimum design length may be any length at which acceptable performance is provided using a given fabrication technology. Transistors 305 and 306 may have a width of 2.4 and a length of 1, Transistors 302 and 304 may have a width of 2.4 and a length of 4. Inverter 307 may comprise a PMOS transistor having a width of 3 and a length of 1.5 and an NMOS transistor having a width of 1.6 and a length of 1.

Transistors 309 and 310 may have a width of 30 and a length of 2. Transistors 308 may have a width of 6 and a length of 2. Transistors 308, 309, and 310 may be longer than the minimum design length so as to minimize dependence between the voltages on differential lines 311 and 312 and the current through transistors 309 and 310. Transistors 308, 309, and 310 may have the same length so as to maintain the same threshold for all three transistors. The width of transistor 308 may be less than the widths of transistors 309 and 310 to minimize the power dissipation of transistor 308. For example, the width of transistor 308 may be one fifth the width of each of transistors 309 and 310 to keep the current through transistor 308 at one fifth the current through each of transistors 309 and 310. Transistors 308, 309, and 310 may be fairly wide to help maintain the same threshold for all three transistors.

The ratios of transistors 301, 302, 303, and 304 may be selected to cause the feedback mechanism of the circuit of FIG. 3 to be activated at a fairly high voltage. By maintaining a fairly high activation threshold, unnecessary power dissipation can be avoided by preventing transistors 309 and 310 from draining more charge than necessary. Also, a high activation threshold reduces the need for a circuit such as that illustrated in FIG. 4 to be used in conjunction with the circuit of FIG. 3.

One embodiment of the circuit illustrated in FIG. 4 may be practiced with the device geometries described above in relation to one embodiment of the circuit of FIG. 3. To improve performance of an embodiment based on the circuit of FIG. 4, the device geometries may be adjusted using circuit simulation software or other means.

For example, the widths of PMOS transistors may be increased relative to their corresponding NMOS transistors in the circuit of FIG. 3. The lengths of PMOS transistors 401, 403, 405, 408, 409, and 410, and the PMOS portion of inverter 407 may be reduced relative to their corresponding NMOS transistors in the circuit of FIG. 3.

Also, the widths of NMOS transistors 402, 404, and 406, and the NMOS portion of inverter 407 may be reduced relative to their corresponding PMOS transistors in the circuit of FIG. 3. The lengths of NMOS transistors 402, 404, and 406, and the NMOS portion of inverter 407 may be increased relative to their corresponding PMOS transistors in the circuit of FIG. 3. Such adjustments can be used to compensate for differences between characteristics of NMOS and PMOS devices, for example differences between the effective resistances ($r_{on}$) of NMOS and PMOS devices.

The layout of current mirror devices such as NMOS transistors 309 and 310 and PMOS transistors 409 and 410 should as symmetric as possible. The directional orientation of the source and drain of the transistors should be the same for both. The transistors should be fabricated adjacent to one another and taps placed symmetrically nearby.

The source and substrate nodes of current mirror devices such as NMOS transistors 308, 309, and 310 and PMOS transistors 408, 409, and 410 should be as close to each other as possible. In one embodiment of the present invention, a single short piece of metal 1 layer connects these nodes.

Embodiments such as those illustrated in FIGS. 3 and 4 may be practiced alone or may be combined to provide protection against common mode noise of both polarities. In some environments, for example where the differential lines are pre-charged, the combination of the influence of the pre-charging and the use of an embodiment such as that illustrated in FIG. 3 may be adequate to avoid conduction of both parasitic diodes coupled to a positive voltage supply and parasitic diodes coupled to a negative voltage supply. Likewise, in some environments, an embodiment such as that illustrated in FIG. 4 may provide protection against conduction of both parasitic diodes coupled to a positive voltage supply and parasitic diodes coupled to a negative voltage supply.

When the present invention is practiced so as to include both of the embodiments of FIGS. 3 and 4, the activation threshold of the circuit based on FIG. 3 should be set higher than the activation threshold of the circuit based on FIG. 4 to minimize power dissipation. The activation thresholds may be close to each other or may be substantially different as long as the activation thresholds provide activation of the circuit before the parasitic diode conduction thresholds can be reached-in response to future noise.

Figure 5:
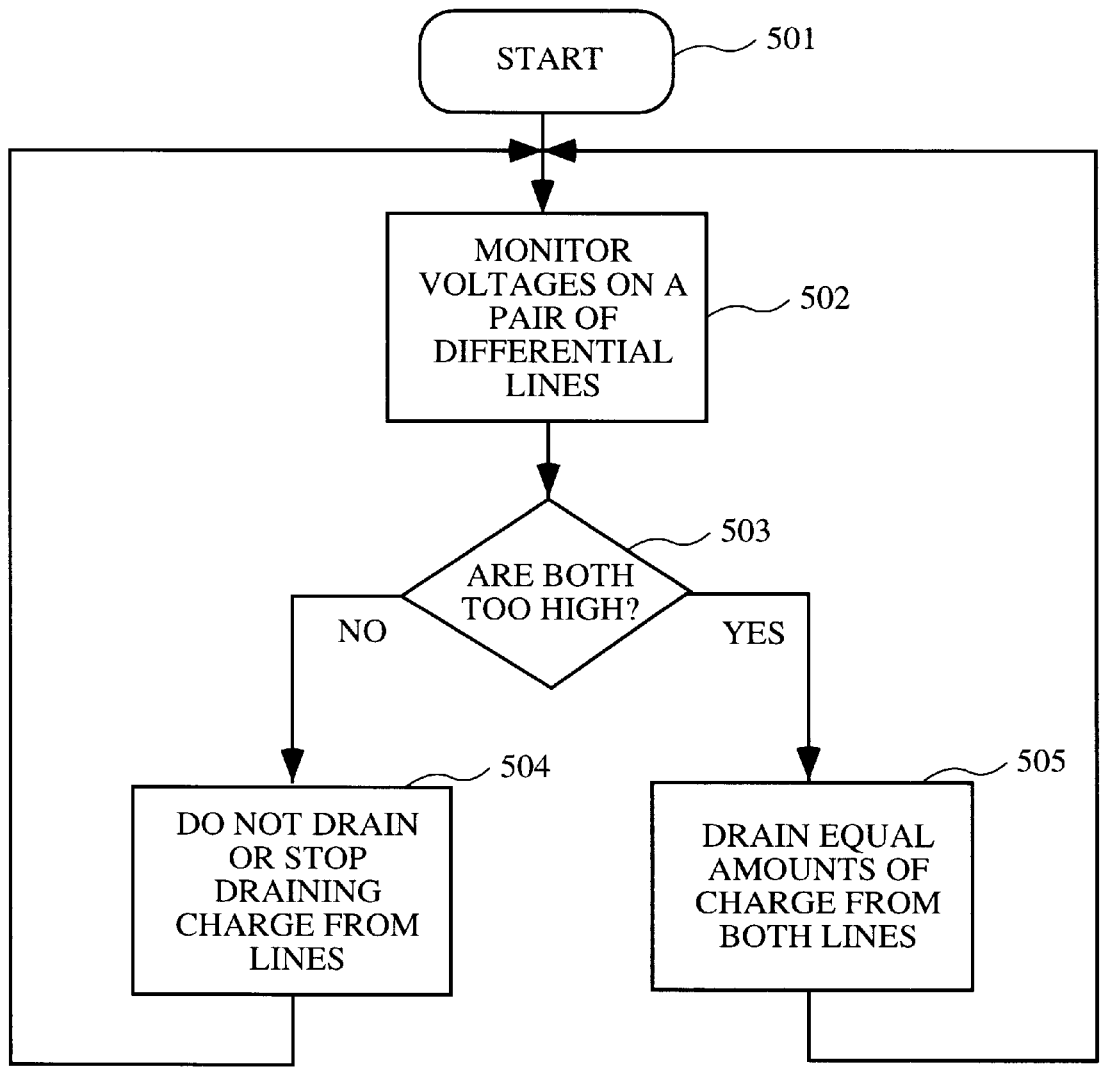
FIG. 5 is a flowchart illustrating one embodiment of a method according to the present invention.

FIG. 5 is a flowchart illustrating one embodiment of a method according to the present invention. The method begins at step 501 and continues at step 502. At step 502, the method monitors voltages on a pair of differential lines. Step 503 is a decision block. At step 503, a decision is made as to whether or not the voltage at the differential lines is too high.

If the voltage is too high at both of the differential lines, the method continues at step 505. At step 505, the method drains equal amounts of charge from both differential lines. From step 505, the method returns to step 502. If the voltage is not too high at both of the differential lines, the method continues at step 504. At step 504, the method does not drain or stops draining charge from the differential lines. From step 504, the method returns to step 502.

Figure 6:
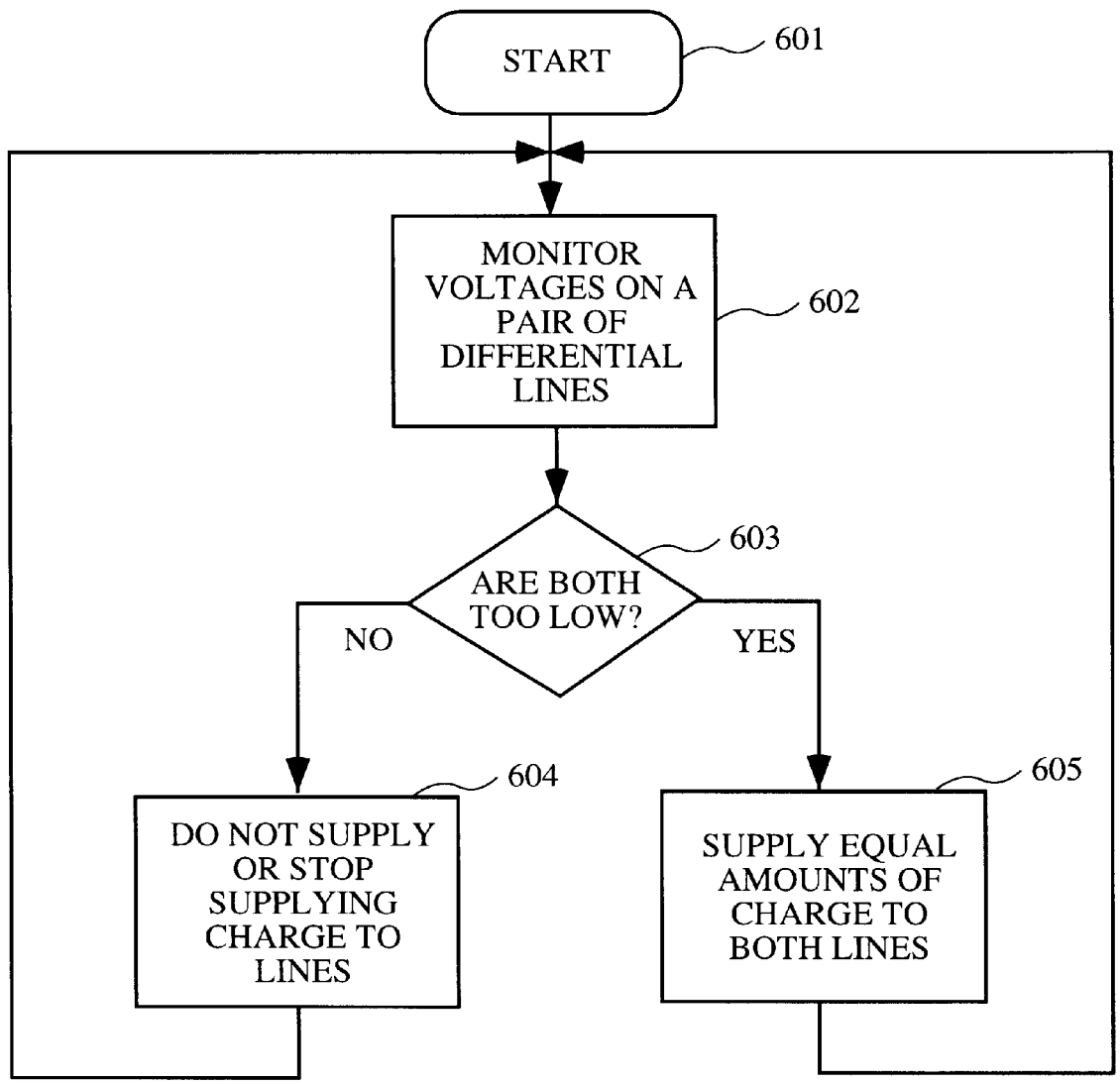
FIG. 6 is a flowchart illustrating one embodiment of a method according to the present invention.

FIG. 6 is a flowchart illustrating another method embodiment according to the present invention. The method of FIG. 6 is an opposite polarity embodiment of the method of FIG. 5. The method begins at step 601 and continues at step 602. At step 602, the method monitors voltages on a pair of differential lines. Step 603 is a decision block. At step 603, a decision is made as to whether or not the voltage at both of the differential lines is too low.

If the voltage is too low at both of the differential lines, the method continues at step 605. At step 605, the method supplies equal amounts of charge to both differential lines. From step 605, the method returns to step 602. If the voltage is not too low at both of the differential lines, the method continues at step 604. At step 604, the method does not supply or stops supplying charge to the differential lines. From step 604, the method returns to step 602.

Figure 7:
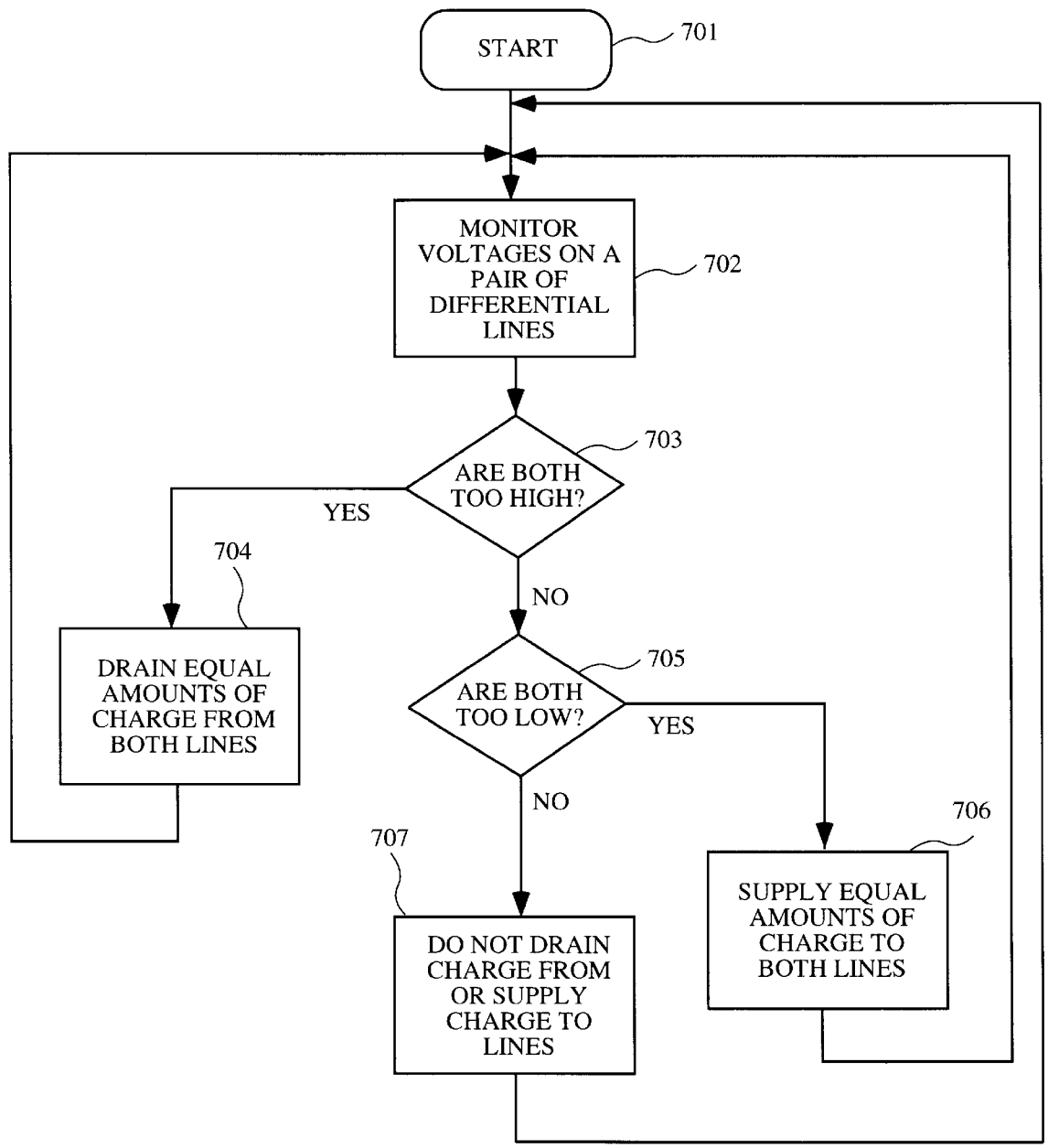
FIG. 7 is a flowchart illustrating one embodiment of a method according to the present invention.

FIG. 7 is a flowchart of an embodiment of the present invention for a circuit that can supply charge to differential lines as well as drain charge from differential lines. The method begins at step 701 and continues at step 702. At step 702, the method monitors voltages on a pair of differential lines. Step 703 is a decision block. At step 703, a decision is made as to whether or not the voltage at both of the differential lines is too high.

If the voltage is too high at both of the differential lines, the method continues at step 704. At step 704, the method drains equal amounts of charge from both differential lines. From step 704 the method returns to step 702. If the voltage is not too high at both of the differential lines, the method continues at step 705. At step 705, a decision is made as to whether or not the voltage at both of the differential lines is too low.

If the voltage is too low at both of the differential lines, the method continues at step 706. At step 706, the method supplies equal amounts of charge to both of the differential lines. From step 706 the method returns to step 702. If the voltage is not too low at both of the differential lines, the method continues at step 707. At step 707, the method does not drain or stops draining charge from the differential lines. From step 707, the method returns to step 702.

Instead of monitoring the voltage on a pair of differential lines as described in the methods of FIGS. 5, 6 and 7, other parameters may be monitored to determine when a response should be initiated. For example, current can be measured. In other embodiments of the present invention other values such as pressure, position, and intensity can be the value that is monitored.

Thus a method and apparatus to improve immunity to common-mode noise have been described. Although the present invention has been described with respect to certain specific embodiments, it will be clear to those skilled in the art that the inventive features of the present invention are applicable to other embodiments as well, all of which are intended to fall within the scope of the present invention.

I claim:

1. A method for improving immunity to common mode noise comprising the steps of:
    monitoring a first voltage on a first differential line and a second voltage on a second differential line;
    determining when both the first voltage and the second voltage exceed a predetermined threshold voltage; and
    draining charge from the first differential line and the second differential line when both the first voltage and the second voltage exceed the predetermined threshold voltage, wherein the charge is drained to cause the first voltage and the second voltage to be reduced by similar amounts, and wherein the charge drained causes at least one of the first and second voltages to be less than the predetermined threshold voltage.

2. The method of claim 1, the first differential line having a first capacitance and the second differential line having a second capacitance, wherein the charge drained from the first and second differential lines is proportional to the first and second capacitances, respectively.

3. The method of claim 1, wherein the first differential line has a capacitance which is substantially equal to a capacitance of the second differential line.

4. The method of claim 3, wherein the amount of charge drained from the first differential line and the amount of charge drained from the second differential line are substantially equal.

5. The method of claim 1, wherein the step of draining charge further comprises the steps of:
    generating an output voltage when the first voltage and the second voltage exceed the predetermined threshold voltage;
    causing a first current to flow from the first differential line to a supply voltage terminal in response to the output voltage; and
    causing a second current to flow from the second differential line to the supply voltage terminal in response to the output voltage.

6. The method of claim 5, wherein the first current is substantially equal to the second current.

7. The method of claim 5, wherein the first and second currents are generated by a current mirror circuit that is controlled by the output voltage.

8. The method of claim 1, wherein the first differential line and the second differential line are coupled to a circuit having a power supply terminal for receiving a power supply voltage, and wherein the predetermined threshold voltage is substantially equal to:
    the power supply voltage, plus a smaller of either a first forward voltage or a second forward voltage, the first forward voltage being a voltage across a first parasitic diode existing between the first differential line and the power supply terminal, and the second forward voltage being a voltage across a second parasitic diode existing between the second differential line and the power supply terminal, minus a maximum allowable noise fluctuation for the first and second voltages, minus a predetermined maximum voltage differential between the first differential line and the second differential line.

9. An apparatus for improving immunity to common mode noise comprising:
    a pair of differential lines comprising a first differential line for receiving a first voltage and a second differential line for receiving a second voltage;
    a sensing circuit coupled to said pair of differential lines for sensing said first voltage, for sensing said second voltage, and for providing an indication when both said first voltage and said second voltage exceed a predetermined threshold voltage; and
    a charge draining circuit coupled to said sensing circuit for draining charge from said first differential line and said second differential line upon receiving said indication.

10. The apparatus of claim 9 wherein said charge draining circuit drains charge equally from said first differential line and from said second differential line.

11. The apparatus of claim 10 wherein said charge draining circuit comprises a current mirror circuit.

12. A method for improving immunity to common mode noise comprising the steps of:

monitoring a first voltage on a first differential line and a second voltage on a second differential line;

determining when both the first voltage and the second voltage are less than a first predetermined threshold voltage; and charging the first differential line and the second differential line when both the first voltage and the second voltage are less than the first predetermined threshold voltage, wherein the first and second differential lines are charged sufficiently to cause the first voltage and the second voltage to be increased by similar amounts, and wherein the charging causes at least one of the first and second voltages to exceed the first predetermined threshold voltage.

13. The method of claim 12, the first differential line having a first capacitance and the second differential line having a second capacitance, wherein the charge supplied to the first and second differential lines is proportional to the first and second capacitances, respectively.

14. The method of claim 12, wherein the first differential line has a capacitance which is substantially equal to a capacitance of the second differential line.

15. The method of claim 14, wherein the amount of charge supplied to the first differential line and the amount of charge supplied to the second differential line are substantially equal.

16. The method of claim 12, wherein the step of charging further comprises the steps of:

generating an output voltage when the first voltage and the second voltage are less than the first predetermined threshold voltage;

causing a first current to flow from a supply voltage terminal to the first differential line in response to the output voltage;

causing a second current to flow from the supply voltage terminal to the second differential line in response to the output voltage.

17. The method of claim 16, wherein the first current is substantially equal to the second current.

18. The method of claim 16, wherein the first and second currents are generated by a current mirror circuit that is controlled by the output voltage.

19. The method of claim 12, wherein the first differential line and the second differential line are coupled to a circuit having a power supply terminal for receiving a power supply voltage, and wherein the first predetermined threshold voltage is substantially equal to:

the power supply voltage, minus a smaller of either a first forward voltage or a second forward voltage, the first forward voltage being a voltage across a first parasitic diode existing between the first differential line and the power supply terminal, and the second forward voltage being a voltage across a second parasitic diode existing between the second differential line and the power supply terminal, plus a maximum allowable noise fluctuation for the first and second voltages, plus a maximum predetermined voltage differential to be applied between the first differential line and the second differential line.

20. The method of claim 12, further comprising the steps of:

determining when both the first voltage and the second voltage exceed a second predetermined threshold voltage, the second predetermined threshold voltage being larger than the first predetermined threshold voltage; and discharging the first differential line and the second differential line when both the first voltage and the second voltage exceed the second predetermined threshold voltage, wherein the discharging causes the first voltage and the second voltage to be reduced by similar amounts, and wherein the discharging causes at least one of the first and second voltages to be less than the second predetermined threshold voltage.

21. An apparatus for improving immunity to common mode noise comprising:

a pair of differential lines comprising a first differential line for receiving a first voltage and a second differential line for receiving a second voltage;

a sensing circuit coupled to said pair of differential lines for sensing said first voltage, for sensing said second voltage, and for providing an indication when both said first voltage and said second voltage fall below a predetermined threshold voltage; and a charge supplying circuit coupled to said sensing circuit for charging the first differential line and the second differential line upon receiving said indication.

22. The apparatus of claim 21 wherein said charge supplying circuit supplies charge equally to said first differential line and to said second differential line.

23. The apparatus of claim 22 wherein said charge supplying circuit comprises a current mirror circuit.

24. The apparatus of claim 21, wherein said sensing circuit further provides a second indication when both said first voltage and said second voltage exceed a second predetermined threshold voltage, further comprising:

a charge draining circuit coupled to said sensing circuit for discharging said pair of differential lines upon receiving said second indication.

* * * * *